(12) United States Patent
Kobinata

(10) Patent No.: US 6,638,665 B2
(45) Date of Patent: Oct. 28, 2003

(54) METHOD AND APPARATUS FOR DESIGNING EB MASK

(75) Inventor: Hideo Kobinata, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 174 days.

(21) Appl. No.: 09/956,143

(22) Filed: Sep. 20, 2001

(65) Prior Publication Data

US 2002/0037459 A1 Mar. 28, 2002

(30) Foreign Application Priority Data

Sep. 22, 2000 (JP) ........................... 2000-288752

(51) Int. Cl.⁷ .................. G03F 9/00; G03C 5/00
(52) U.S. Cl. .............. 430/5; 430/30; 430/296; 430/942
(58) Field of Search .................. 430/5, 30, 296, 430/942

(56) References Cited

FOREIGN PATENT DOCUMENTS

| JP | 9-129544 | 5/1997 |
| JP | 10-284394 | 10/1998 |
| JP | 11-237728 | 8/1999 |

*Primary Examiner*—Christopher G. Young
(74) *Attorney, Agent, or Firm*—Young & Thompson

(57) ABSTRACT

In the method of designing EB (electron beam) mask, it includes the steps of (a) to (d). The step of (a) is the step of dividing an integrated circuit pattern into two complementary patterns. The step of (b) is the step of scanning around one, as an object pattern, of small patterns included in one of the two complementary patterns, while measuring a distance from the object pattern to the small patterns adjacent to the object pattern. The step of (c) is the step of registering a minimum of distances from the object pattern to the adjacent small patterns. The step of (d) is the step of changing a shape of at least one of the small patterns based on the minimum distance.

12 Claims, 11 Drawing Sheets

METHOD AND APPARATUS FOR DESIGNING EB MASK

BACKGROUND OF THE INVENTION

1. Field of the Invention

The present invention relates to a method of and an apparatus for designing an EB (Electron Beam) mask, which is used in an electron beam exposing apparatus to draw a predetermined pattern on a semiconductor substrate.

2. Description of the Related Art

In recent years, in a process for manufacturing a semiconductor integrated circuit apparatus, a micro fabrication technique has been actually used for using a focused beam of a charged particle line, such as an electron beam, an ion beam or the like, and then drawing an integrated circuit pattern. For example, an electron beam exposing apparatus radiates an electron beam onto a wafer on which electron line sensitive resist is coated, and accordingly exposing an integrated circuit pattern. At this time, an EB mask is used in order to obtain a drawing pattern through the electron beam.

As an electron beam usage drawing technique using an electron beam, a partially collectedly or entirely collectedly exposing technique is known for contracting and projecting a pattern of the EB mask, and then collectedly drawing a unit region, such as a memory cell and the like, on a wafer.

Those exposing methods usually use two masks. At first, a first mask is used to adjust the electron beam to a rectangular shape. Next, the adjusted electron beam is radiated to a second mask. The second mask has a plurality of rectangular cell apertures where a partial pattern in which a part of an integrated circuit pattern to be radiated onto the wafer is picked up is formed. Then, these cell apertures are reduced to several one-tenths by an electronic optical system, and transcribed onto the wafer. Accordingly, the collected exposure is done. Such a partially collectedly or entirely collectedly exposing method not only reduces the number of shots to improve throughput, but also improves the connection accuracy of the shots, the picture quality of a slant pattern and the compressive performance of pattern data. Thus, this has an excellent point that even if the hyperfineness is increased, it does not have a direct influence on a wafer drawing time.

Incidentally, in the mask used in the collectedly exposing method as mentioned above, there are a stencil type EB mask in which a mask hole for allowing the electron beam to pass through is made correspondingly to the integrated circuit pattern, and a membrane type EB mask in which a film for shielding the electron beam is formed correspondingly to the integrated circuit pattern.

As shown in FIG. 1A, the stencil type EB mask in the two kinds has a problem that a region whose circumference is perfectly surrounded with the mask hole (slant line portion) can not be prepared since there is no portion for supporting it (hereafter, referred to a donut problem). As shown in FIG. 1B, in a region whose circumference except a slight portion is surrounded with the mask hole (slant line portion), it is impossible to sufficiently have the strength of the portion to support it. Thus, this brings about a problem that the supporting portion is deformed and damaged (hereafter, referred to as a leaf problem).

So, in order to prepare the stencil type EB mask, the donut problem and the leaf problem are solved as follows. That is, the conventional method of designing the EB mask divides the integrated circuit pattern into two complementary patterns, and makes the mask holes in the two EB masks, respectively. For example, it is prepared as shown in FIG. 2A, for the integrated circuit pattern shown in FIG. 1A, and it is prepared as shown in FIG. 2B, for the integrated circuit pattern shown in FIG. 1B. Then, the integrated circuit pattern is contracted and transcribed onto the wafer by the sequential exposure using the two EB masks on which the complementary masks are formed (hereafter, it may be referred to as a complementary mask).

When the complementary pattern is formed on the stencil type EB mask, a photolithography technique is usually used to form a desirable resist pattern on a mask, and a mask hole is made by etching. Here, when the resist pattern is formed on the mask, an optimal exposure amount is different between a pattern having an extremely wide line width and a pattern having a narrow line width. Thus, it is desirable to avoid an open (mask hole) pattern of a large area as much as possible.

Also, when the integrated circuit pattern is divided into two complementary patterns, in order to make the optimal exposure amount constant and reduce the blur of the electron beam caused by a coulomb effect at the time of the contraction and the transcription onto the wafer, it is desirable to make the area densities of the mask holes of the two complementary masks equal to each other.

For this reason, the conventional method of designing the EB mask not only considers the donut problem and the leaf problem, but also tries to remove the existence of the mask hole having the large area. At the same time, it makes the area densities of the mask holes of the two complementary masks equal to each other. For this reason, it employs a method of cutting and dividing the integrated circuit pattern at a predetermined length.

However, in such a dividing method, when the pattern of the large area exists in the integrated circuit pattern, if it is divided into two complementary patterns so that the area densities are equal to each other, there may be a case that a point contact pattern at which the mask holes are linked at one point is generated, as shown in FIG. 3. Also, there may be a fear that a micro bridge pattern at which the mask holes are linked in a micro dimensional pattern is generated, as shown in FIG. 4.

The point contact pattern and the micro bridge pattern are weak in mechanical strength. Thus, there may be a fear that the EB mask is damaged. For this reason, such a complementary mask can not be prepared (hereafter, referred to as a checkered flag problem).

The conventional apparatus for designing the EB mask does not have the function of detecting the point contact pattern or the micro bridge pattern. For this reason, a designer detects the point contact pattern or the micro bridge pattern in a visual manner or the like. Then, if there is the point contact pattern or the micro bridge pattern, the shape of the complementary pattern is changed to then cope with the checkered flag problem.

However, if the person detects the point contact pattern or the micro bridge pattern and modifies the complementary pattern as mentioned above, this requires a large number of design steps and an expensive cost, and TAT becomes long. Also, the oversight of the point contact pattern or the micro bridge pattern disables the occurrence of the checkered flag problem to be perfectly solved.

Japanese Laid Open Patent Application (JP-A-Heisei, 11-237728) discloses the following drawing method and drawing apparatus.

The first drawing method includes the steps of dividing a drawing pattern including repetition patterns into a frame in which a boundary line is inclined for an array direction of the repetition patterns, and a step of drawing by using a charged particle beam or a laser beam for each frame with regard to a sample.

The second drawing method includes the steps of dividing a drawing pattern including repetition patterns into a frame in which a boundary line is inclined for an array direction of the repetition patterns, and a step of setting the boundary line of the frame at a serration state and then drawing by using a charged particle beam or a laser beam for each frame with regard to a sample.

Its drawing apparatus is the drawing apparatus having the device that can carry out the two steps of the first drawing method.

Japanese Laid Open Patent Application (JP-A-Heisei, 10-284394) discloses the following method of and apparatus for exposing a charged beam.

This method of exposing the charged beam installs a mask in a beam path of an optical mirror cylinder for a charged beam, and divides at least a part of a pattern on the mask into small regions, and places on the mask, and then changes an illumination beam to the small regions on the upstream side from the mask, and thereby illuminates to a particularly small region, and creates and transcribes an image of the small region onto an exposed surface, and further couples and arrays the small regions on the exposed surface, and accordingly generates at least a part of a predetermined large region pattern, and this method of exposing the charged beam is characterized in that it detects an alignment mark placed on the exposed surface, and thereby detects a positioning error in a rotational direction on the exposed surface, and then uses a rotation lens mounted in a projection lens system between the mask and the exposed surface, and then rotates the transcription image of the mask pattern, and thereby compensates the error, and accordingly improves the linkage accuracy between the transcribed images adjacent to each other on the exposed surface.

Also, the apparatus for exposing the charged beam is the apparatus for exposing the charged beam, which has a unit that can carry out the above-mentioned method of exposing the charged beam.

Japanese Laid Open Patent Application (JP-A-Heisei, 9-129544) discloses the following method of transcribing a charged particle line.

In this method of transcribing a charged particular line which divides a transcription pattern formed on a mask into a plurality of main visual fields, and also divides each of the plurality of main visual fields into a plurality of sub visual fields, and sequentially radiates a charged particle line for each of the plurality of sub visual fields, and then transcribes the pattern of each of the sub visual fields through an image creation lens system onto a substrate, and also shifts the mask and the substrate in synchronization with each other, and accordingly transcribes the transcription pattern onto the substrate, this method of transcribing the charged particle line is characterized in that it compensates the distortion of the pattern transcribed onto the substrate for each sub visual field.

SUMMARY OF THE INVENTION

The present invention is accomplished in view of the above mentioned problems.

Therefore, an object of the present invention is to provide a method of and an apparatus for designing an EB mask which can surely detect a point contact pattern and a micro bridge pattern, and cope with a checkered flag problem.

Another object of the present invention is to provide a method of and an apparatus for designing a stencil type EB mask in which not only the donut problem and the leaf problem but also the checkered flag problem can be solved.

Still another object of the present invention is to provide a method of and an apparatus for designing an EB mask in which it is not necessary for the designer to detect the point contact pattern and the micro bridge pattern and modify the complementary pattern.

In order to achieve an aspect of the present invention, the present invention provides a method of designing EB (electron beam) mask, including the steps of (a) to (d). The step of (a) is the step of dividing an integrated circuit pattern into two complementary patterns. The step of (b) is the step of scanning around one, as an object pattern, of small patterns included in one of the two complementary patterns, while measuring a distance from the object pattern to the small patterns adjacent to the object pattern. The step of (c) is the step of registering a minimum of distances from the object pattern to the adjacent small patterns. The step of (d) is the step of changing a shape of at least one of the small patterns based on the minimum distance.

In the method of designing EB mask, the step of (d) may include the step of (e). The step of (e) is the step of adding an auxiliary pattern between the object pattern and the most adjacent one of the adjacent small patterns.

In the method of designing EB mask, the step of (e) may includes the steps of (f) and (g). The step of (f) is the step of adding the auxiliary pattern in the one complementary pattern. The step of (g) is the step of deleting a pattern having the same shape as that of the auxiliary pattern from a place corresponding to the auxiliary pattern in the other of the two complementary patterns.

In the method of designing EB mask, the step of (d) may includes the step of (h). The step of (h) is the step of shifting a part of the one complementary pattern in a predetermined direction.

In the method of designing EB mask, the step of (h) may includes the steps of (i) and (j). The step of (i) is the step of shifting the part of the one complementary pattern in the predetermined direction. The step of (j) is the step of deleting a pattern having the same shape as that of the part from a place corresponding to the part in the other of the two complementary patterns.

In the method of designing EB mask, the step of (b) may includes the step of (k). The step of (k) is the step of stopping the scan, if the distance exceeds a threshold.

In order to achieve another aspect of the present invention, the present invention provides an apparatus for designing EB mask including a memory and a processor. The memory stores data. The processor divides an integrated circuit pattern into two complementary patterns; scans around one, as an object pattern, of small patterns included in one of the two complementary patterns, while measures a distance from the object pattern to the small patterns adjacent to the object pattern; registers a minimum of distances from the object pattern to the adjacent small patterns in the memory; and changes a shape of at least one of the small patterns based on the minimum distance.

In the apparatus for designing EB mask, the processor may add an auxiliary pattern between the object pattern and the most adjacent one of the adjacent small patterns.

In the apparatus for designing EB mask, the processor may add the auxiliary pattern in the one complementary pattern; and delete a pattern having the same shape as that of the auxiliary pattern from a place corresponding to the auxiliary pattern in the other of the two complementary patterns.

In the apparatus for designing EB mask, the processor may shift a part of the one complementary pattern in a predetermined direction.

In the apparatus for designing EB mask, the processor may shift the part of the one complementary pattern in the predetermined direction; and delete an pattern having the same shape as that of the part from a place corresponding to the part in the other of the two complementary patterns.

In the apparatus for designing EB mask, the processor may stop the scan, if the distance exceeds a threshold.

DESCRIPTION OF THE PREFERRED EMBODIMENT

The present invention will be described below with reference to the attached drawings.

Figure 5:
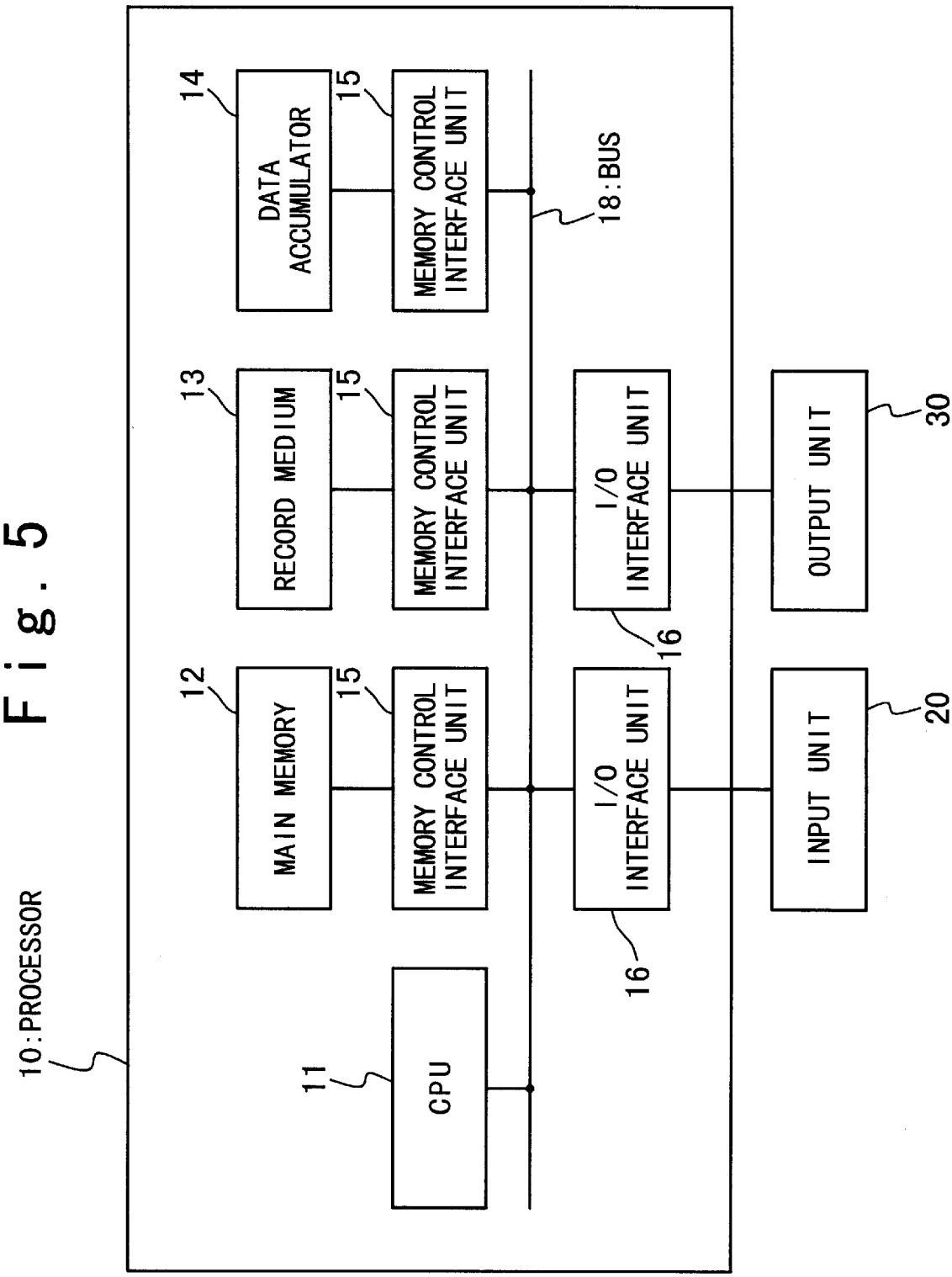
FIG. 5 is a block diagram showing one configuration example of an apparatus for designing an EB mask according to the present invention.
Figure 6:
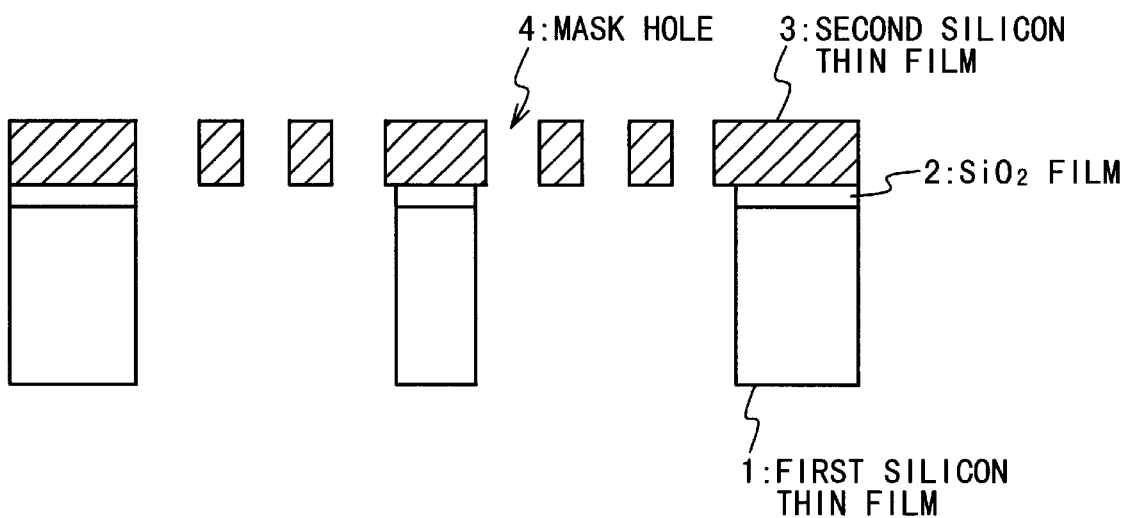
FIG. 6 is a side sectional view showing one configuration example of an EB mask.

FIG. 5 is a block diagram showing one configuration example of an apparatus for designing an EB mask according to the present invention. And, FIG. 6 is a side sectional view showing one configuration example of an EB mask.

An apparatus for designing an EB mask according to the present invention is constituted by a computer, such as a workstation and the like. As shown in FIG. 5, it is provided with: a processor 10 for executing a predetermined process in accordance with a program; an input unit 20 for inputting a command, information, data and the like to the processor 10; and an output unit 30 for displaying or outputting the result processed by the processor 10.

The processor 10 is provided with: a CPU 11; a main memory 12 for transiently (temporary) storing information (data) necessary for a process in the CPU 11; a record medium 13 for recording a program that instructs the CPU 11 to execute a predetermined program; a data accumulator 14 for recording various pattern data of the EB mask and the like; a memory control interface unit 15 for controlling a data transfer between the main memory 12, the record medium 13 and the data accumulator 14; and an I/O interface unit 16 serving as an interface unit between the processor 10 and the input unit 20, and also between the processor 10 and the output unit 30. Then, they are connected through a bus 18. The processor 10 executes a process for dividing a pattern of an EB mask, as described below, in accordance with a division process program recorded in the record medium 13.

Incidentally, the record medium 13 may be a magnetic disc, a semiconductor memory, an optical disc, or another record medium. At least one of the main memory 12, the record medium 13 and the data accumulator 14 may exist outside the processor 10, which electrically connect each other.

The stencil type EB mask is configured, for example, as shown in FIG. 6. That is, a second silicon thin film 3 is formed on a first silicon thin film 1 serving as a stem, in which a silicon oxide film ($SiO_2$ film) 2 is put between the first and second silicon thin films 1, 3. A mask hole 4 is made in the second silicon thin film 3.

The data of the EB mask designed by the apparatus for designing the EB mask according to the present invention is transferred to a known drawing apparatus using a light, an electron beam and the like. Then, a complementary pattern is drawn on the second silicon thin film 3 on which resist is coated in accordance with the data. After that, the second silicon thin film 3 is etched to a desired shape and removed to accordingly make a mask hole 4.

Incidentally, in a case of the EB mask shown in FIG. 6, a resist pattern is drawn to form a step on the first silicon thin film 1, similarly to the second silicon thin film 3. Then, the first silicon thin film 1 and the $SiO_2$ film 2 are respectively etched to the desired shapes and removed to accordingly form the stem.

The procedure for designing the EB mask according to the present invention will be described below with reference to the drawings.

Figure 7:
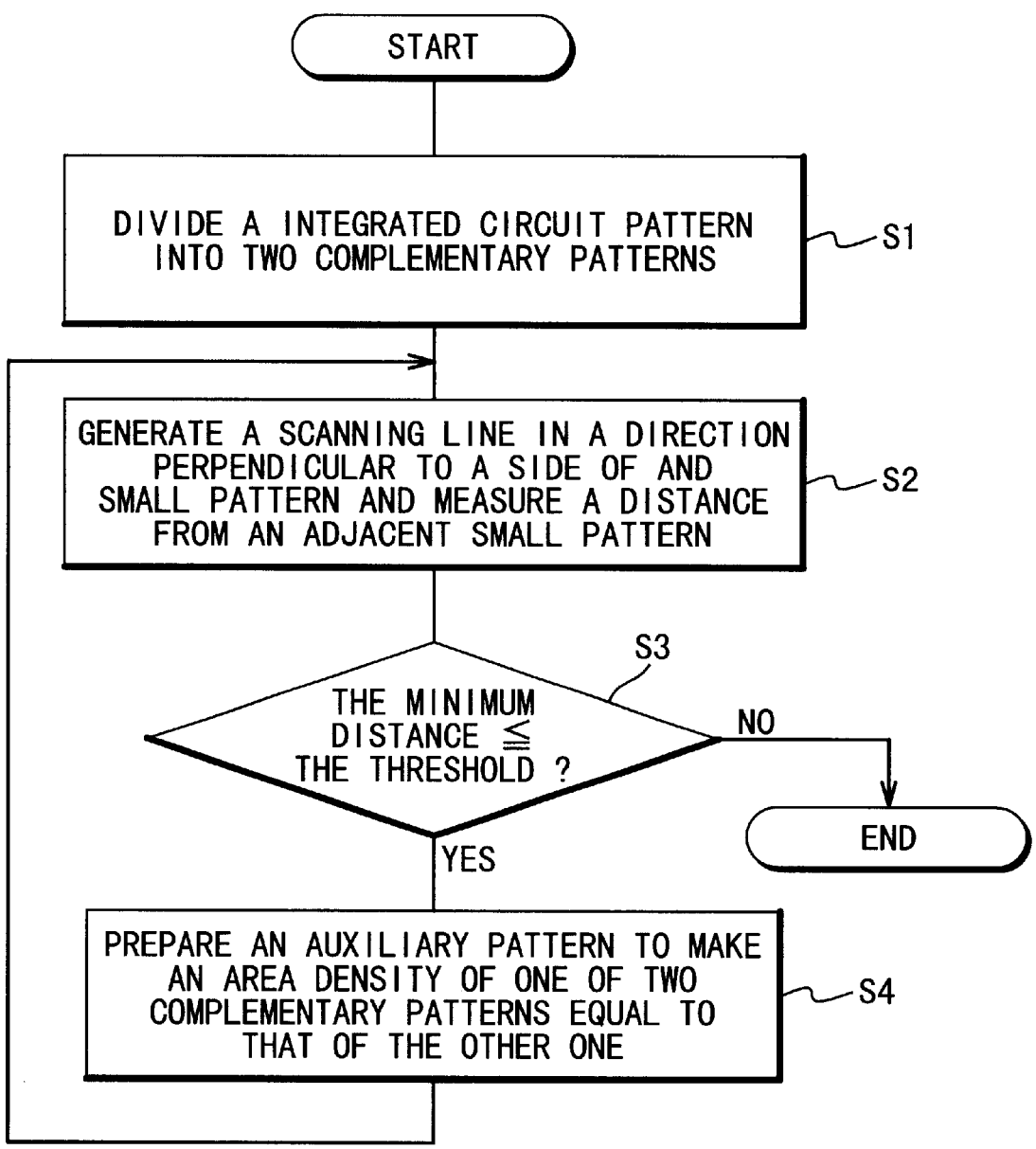
FIG. 7 is a flowchart showing a procedure in a method of designing an EB mask according to the present invention.
Figure 8:
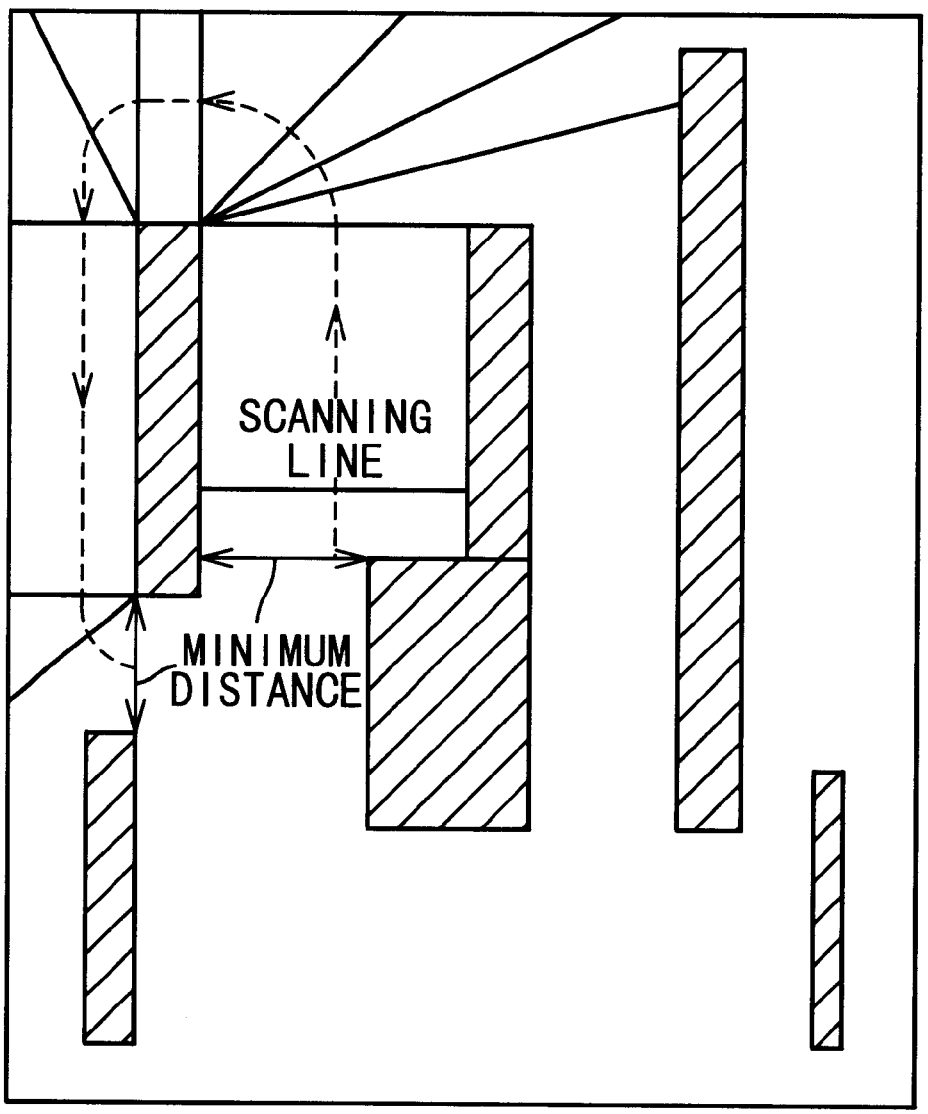
FIG. 8 is a diagrammatic view showing a procedure for detecting a point contact pattern and a micro bridge pattern by using the method of designing an EB mask according to the present invention.
Figure 9:
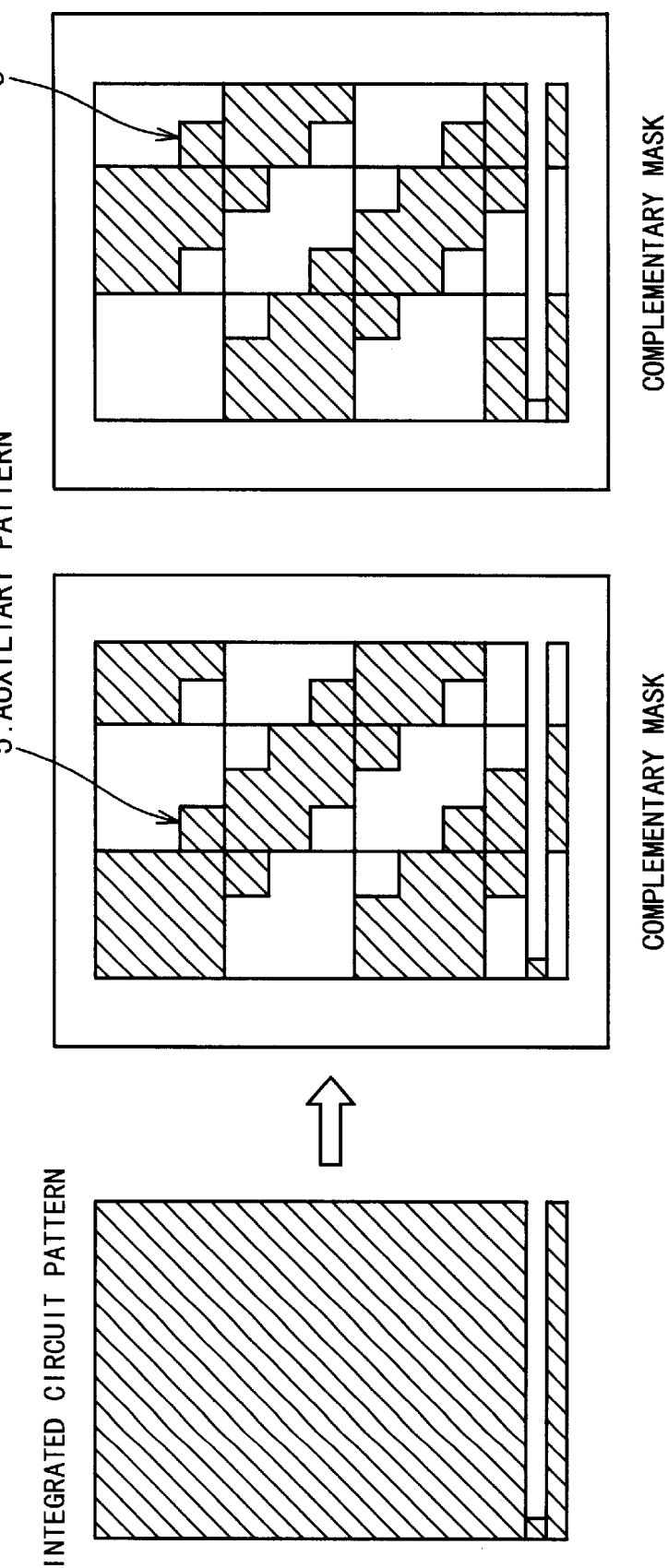
FIG. 9 is a diagrammatic view showing a pattern division example of an EB mask by using the method of designing an EB mask according to the present invention.
Figure 10:
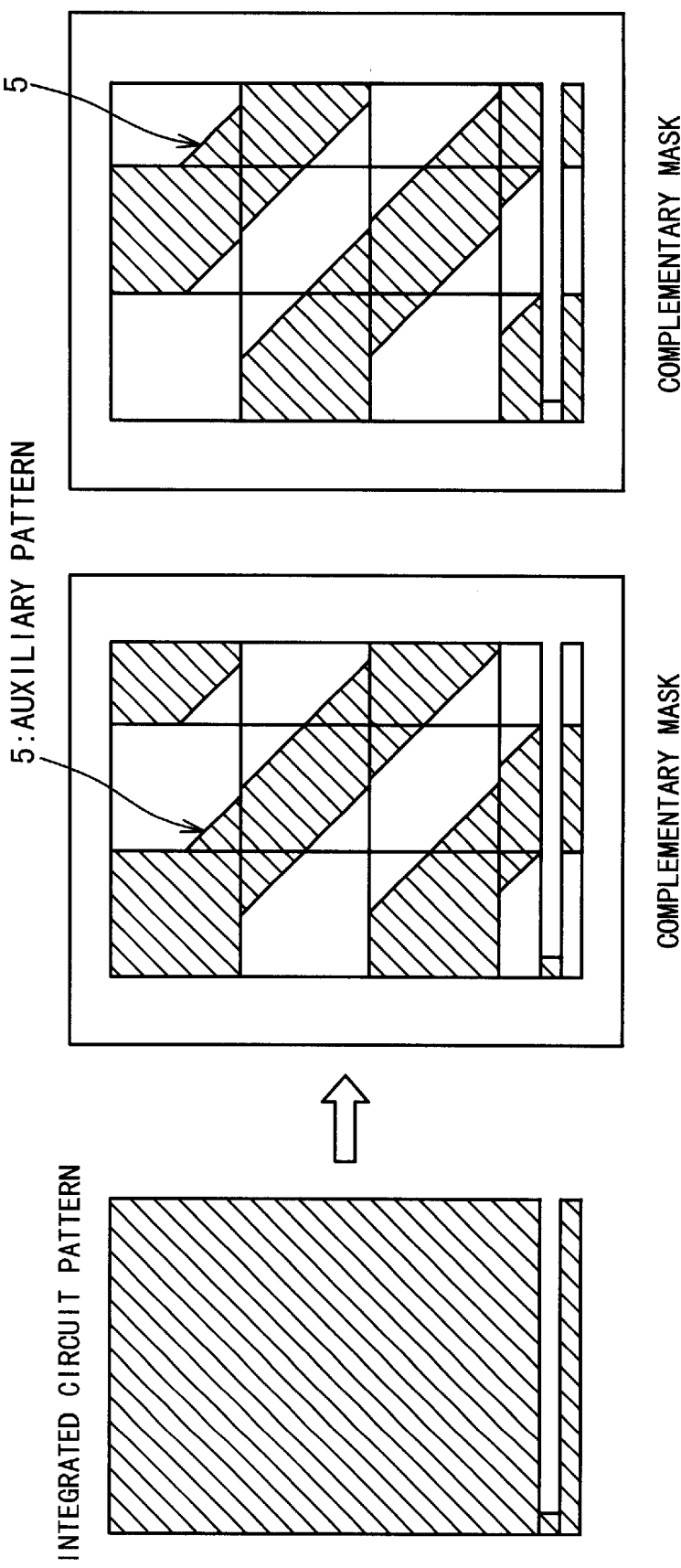
FIG. 10 is a diagrammatic view showing a pattern division example of an EB mask by using the method of designing an EB mask according to the present invention.
Figure 11:
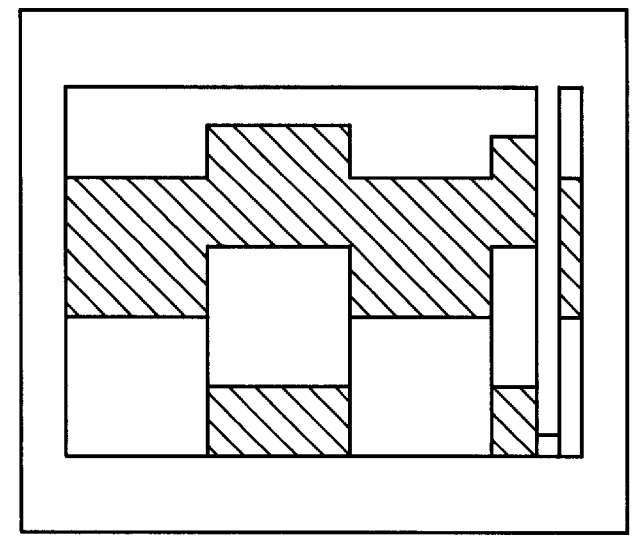
FIG. 11 is a diagrammatic view showing a pattern division example of an EB mask by using the method of designing an EB mask according to the present invention.
Figure 11:
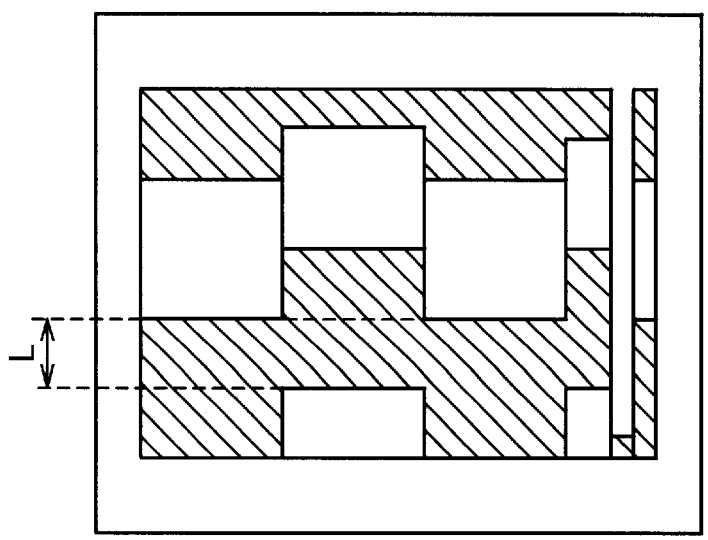
Figure 11:
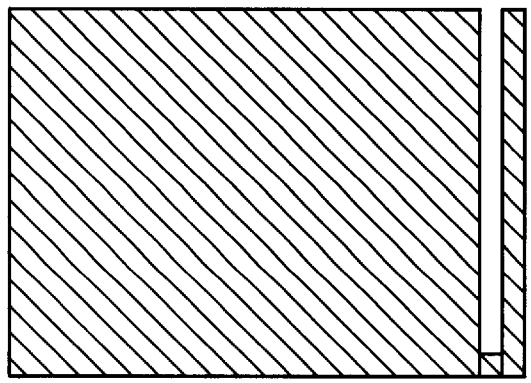

FIG. 7 is a flowchart showing the procedure in the method of designing the EB mask in the present invention. FIG. 8 is a diagrammatic view showing a procedure for detecting the point contact pattern and the micro bridge pattern by using the method of designing the EB mask in the present invention. FIGS. 9 to 11 are the diagrammatic views showing the pattern division example of the EB mask by using the method of designing the EB mask in the present invention.

In FIG. 7, similarly to the conventional method of designing the EB mask, the processor 10 firstly considers the donut problem and the leaf problem, and divides the integrated circuit pattern into the two complementary patterns, and then carries out the design so that there is no mask hole of a large area. Also, the processor 10 cuts and divides the integrated circuit pattern for each predetermined length so that the area densities of the mask holes of the two complementary masks are equal to each other (Step S1).

Each complementary mask includes a plurality of small patterns shown in FIG. 8 as portions with slanted lines.

After dividing the integrated circuit pattern into the two complementary patterns, the processor 10 generates a scanning line form one, as an object pattern, of small patterns in a direction perpendicular to a side of any small pattern, as shown in FIG. 8.

At this time, it generates each scanning line until an arrival at an adjacent small pattern. It registers the length (the distance) in a buffer (main memory 12). Incidentally, if a distance from the object pattern to the adjacent small pattern exceeds a preset predetermined threshold (the second threshold) as a sufficient length to support between the small patterns, the generation of the scanning line may be stopped prior to the arrival at the adjacent small pattern. In this case, it is possible to reduce a calculation time required to determine the distance from the object pattern to the adjacent small pattern.

The scanning line is repeatedly generated for each predetermined interval until it scans around the object pattern, while measuring a distance from the object pattern to the small patterns adjacent to the object pattern. Then, a value registered in the buffer is updated each time a minimum value is measured for each side of the object pattern. Such update causes a coordinate data at the nearest position to the adjacent small pattern and its length (minimum distance) to be respectively stored (registered) in the buffer (Step S2). Incidentally, at each vertex of the object pattern, the scanning line is rotated and generated with the vertex as a center.

Then, for each side of the object pattern, it is judged whether or not the minimum distance registered in the buffer is equal to or less than the preset predetermined threshold (the first threshold) (Step S3). If the minimum distance is equal to or less than the first threshold, the coordinate data and the distance data are kept registered in the buffer in their original states, and the operational flow proceeds to a process at a step S4. Also, if all the minimum distances obtained for each side of the pattern are greater than the first threshold, the corresponding coordinate data and distance data are respectively deleted, and the process is ended.

Incidentally, the first threshold is set at a value similar to the minimum dimension at which the stencil type EB mask can be prepared without any occurrence of deformation and damage.

As the result of the process at the step S3, at a position at which the minimum distance is judged to be equal to or less than the first threshold, it may be considered that the point contact pattern or the micro bridge pattern occurs between the object pattern and the adjacent small pattern.

The processor 10, if detecting the adjacent small pattern having the minimum distance equal to or less than the threshold from the processes at the steps S1 to S3, carries out a reinforcement process for supporting an occurrence portion of the point contact pattern or the micro bridge pattern. The processor 10 changes a shape of at least one of the small patterns based on the minimum distance. For example, the processor 10 prepares an auxiliary pattern 5 shown in FIGS. 9, 10, between the object pattern and the most adjacent one of the adjacent small patterns in addition to the complementary pattern prepared at the step S1 (Step S4).

Figure 1A:
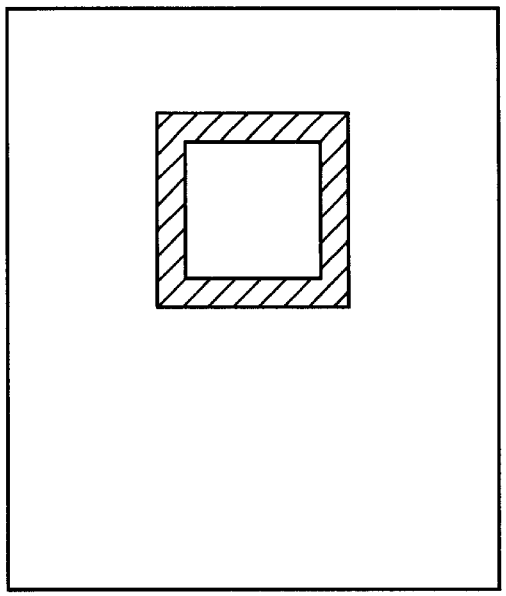
FIG. 1A is a plan view showing an occurrence example of a donut problem, in an example of an EB mask that can not be designed.
Figure 1B:
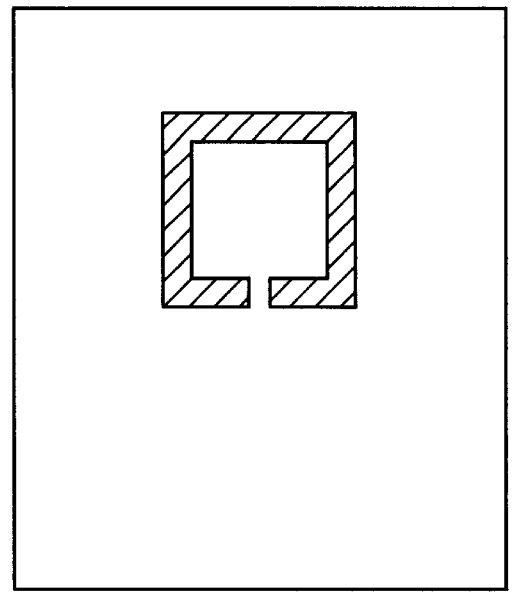
FIG. 1B is a plan view showing an occurrence example of a leaf problem, in an example of an EB mask that can not be designed.
Figure 2A:
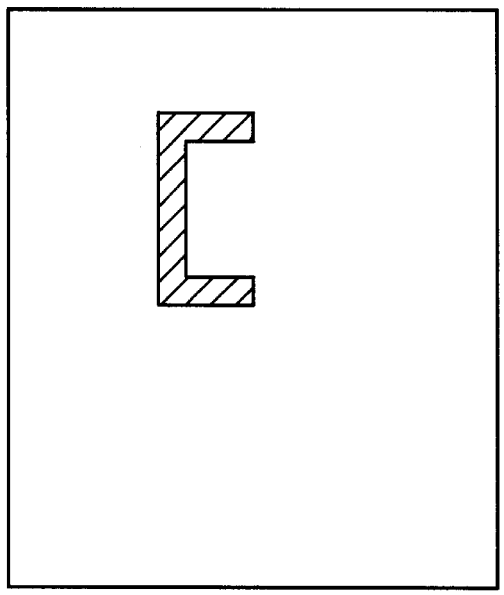
FIG. 2A is a plan view showing a solving example of the donut problem shown in FIG. 1A, in an example of a complementary mask.
Figure 2A:
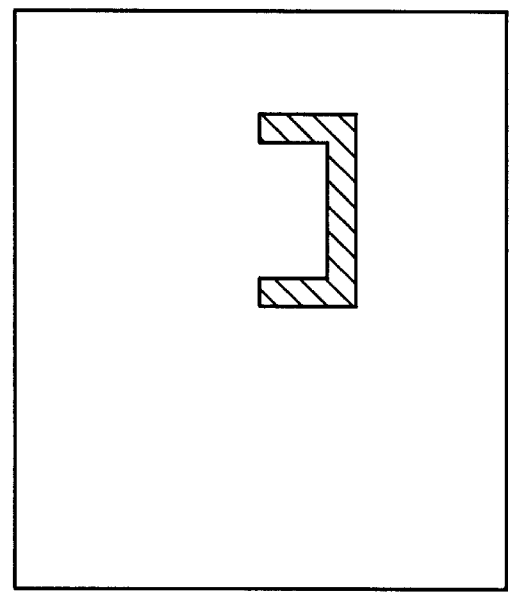
Figure 2B:
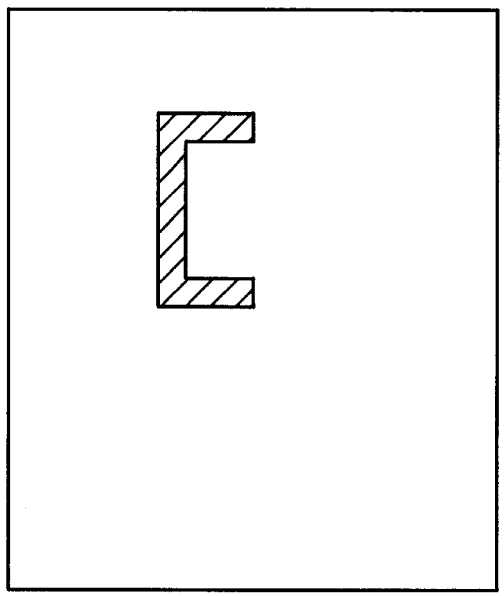
FIG. 2B is a plan view showing a solving example of the leaf problem shown in FIG. 1B, in an example of a complementary mask.
Figure 2B:
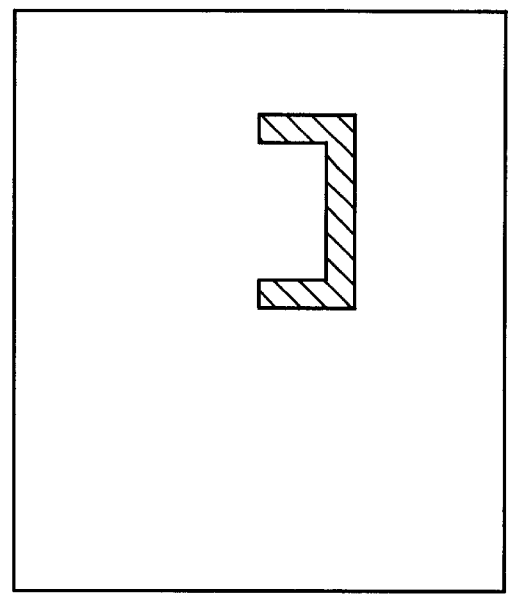
Figure 3:
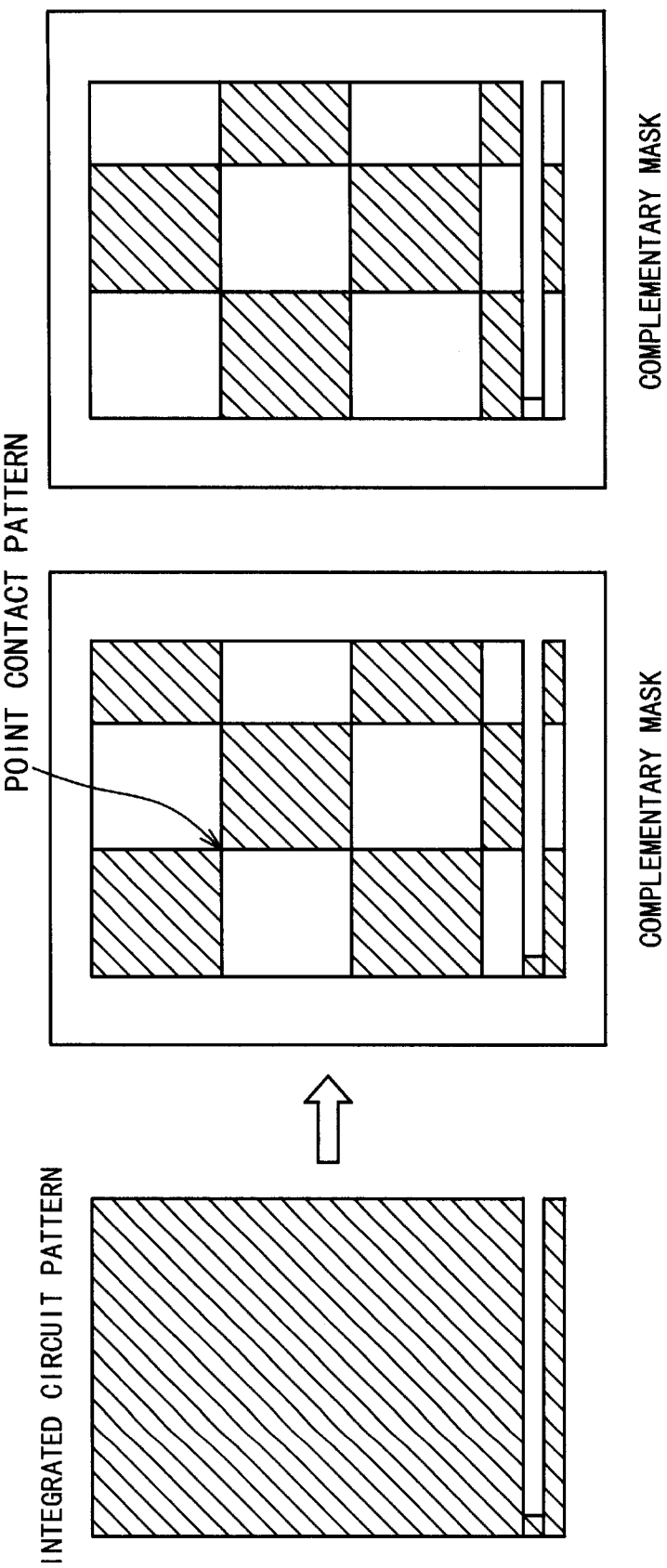
FIG. 3 is a view showing a problem of a conventional method of designing an EB mask, and a plan view of an EB mask showing an occurrence example of a point contact pattern.
Figure 4:
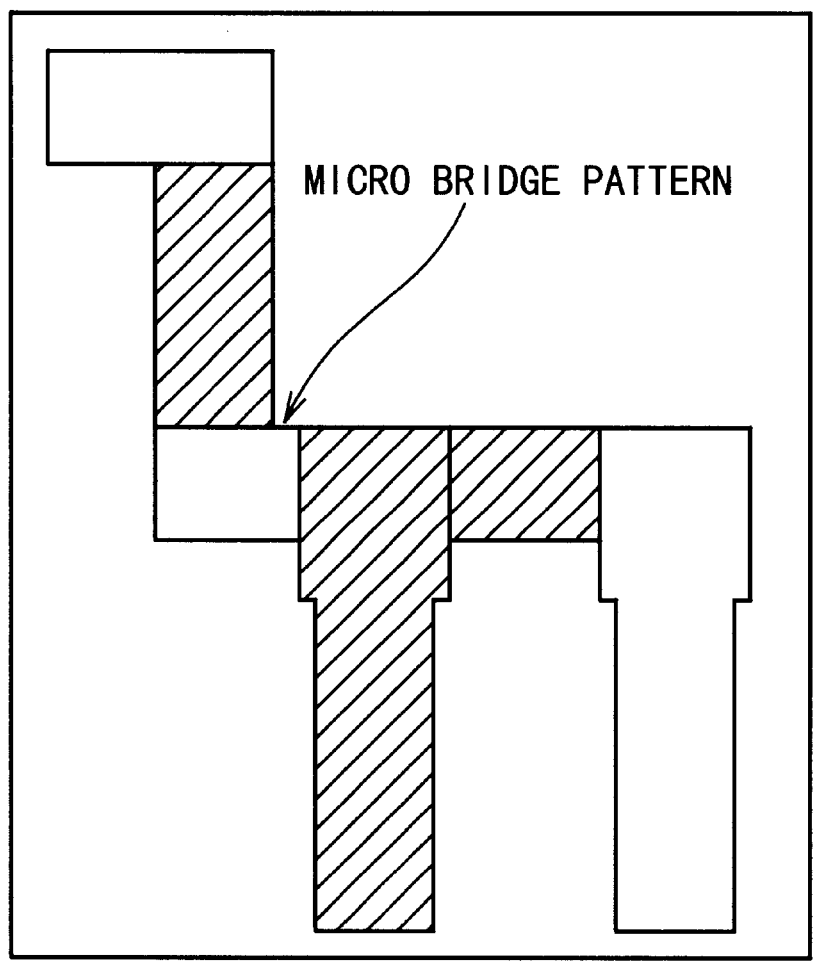
FIG. 4 is a view showing a problem of a conventional method of designing an EB mask, and a plan view of an EB mask showing an occurrence example of a micro bridge pattern.

Incidentally, each of FIGS. 9, 11 shows one example of an auxiliary pattern prepared correspondingly to the point contact pattern shown in FIG. 3.

In the complementary mask shown in FIG. 9, a rectangular auxiliary pattern 5 is prepared in a point contact portion of one complementary mask. Then, the pattern having the same shape as the prepared rectangular auxiliary pattern 5 is deleted from the place corresponding to the auxiliary pattern 5 in the other complementary mask.

Similarly, a rectangular auxiliary pattern 5 is prepared in a point contact portion of the other complementary mask. Then, the pattern having the same shape as the prepared rectangular auxiliary pattern 5 is deleted from the place corresponding to the auxiliary pattern 5 in the one complementary mask.

In the complementary mask shown in FIG. 10, a triangular auxiliary pattern 5 is prepared in a point contact portion of one complementary mask. Then, the pattern having the same shape as the prepared triangular auxiliary pattern 5 is deleted from the place corresponding to the auxiliary pattern 5 in the other complementary mask.

Similarly, a triangular auxiliary pattern 5 is prepared in a point contact portion of the other complementary mask. Then, the pattern having the same shape as the prepared triangular auxiliary pattern 5 is deleted from the place corresponding to the auxiliary pattern 5 in the one complementary mask.

Such execution tries to make the area densities of the complementary patterns of one complementary mask and the other complementary mask substantially equal to each other.

Incidentally, the auxiliary pattern 5 is not limited to the shapes shown in FIGS. 9, 10. Any shape may be used if it is the shape having the sufficient area to support the occurrence portion of the point contact pattern or the micro bridge pattern.

Next, the processor 10 repeats the processes at the steps S2, S3 to the complementary pattern containing the auxiliary pattern 5 prepared at the step S4. Then, it measures the distance from the adjacent small pattern for each side of the small pattern, and confirms that the point contact pattern or the micro bridge pattern does not occur.

The above-mentioned processes at the steps S1 to S4 are performed on all the small patterns constituting the complementary pattern, respectively. Thus, it is possible to design the complementary mask having no point contact pattern and micro bridge pattern.

Thus, the method of designing the EB mask according to the present invention measures the distance from the adjacent small pattern through the scanning line, detects the occurrence portions of the micro bridge pattern and the point contact pattern, and then prepares in the occurrence portions of the detected micro bridge pattern and point contact pattern, the auxiliary patterns 5 to support them, respectively. For this reason, it is possible to obtain the stencil type EB mask in which not only the donut problem and the leaf problem but also the checkered flag problem can be solved. In particular, it is not necessary for the designer to detect the point contact pattern and the micro bridge pattern and modify the complementary pattern. Hence, the point contact pattern and the micro bridge pattern can be surely detected to thereby solve the checkered flag problem caused by the oversight of the point contact pattern and the micro bridge pattern.

Incidentally, as the reinforcement process for the point contact pattern and the micro bridge pattern at the step S4, the following method may be used instead of the addition of the auxiliary patterns shown in FIGS. 9, 10. That is, as shown in FIG. 11, a part of a complementary pattern of one complementary mask is shifted by a predetermined distance L, and a part of a complementary pattern of the other complementary mask is similarly shifted by the predetermined distance L. The above process for changing patterns in the occurrence portions of the point contact pattern and the micro bridge pattern provides the sufficient pattern areas to support them. However, also in this case, it is tried to make the area densities of the complementary patterns of one complementary mask and the other complementary mask equal to each other. Even if a part of the complementary pattern is shifted as mentioned above, the occurrences of the point contact pattern and the micro bridge pattern can be solved to thereby obtain the effect similar to the case of the addition of the auxiliary pattern 5.

The present invention can provide the following effects, since it is configured as mentioned above.

With regard to all the small patterns constituting the complementary pattern, it generates the scanning line in the direction perpendicular to the side of the small pattern. Then, it measures the distance from the adjacent small pattern, and records the minimum distance implying the distance from the most adjacent small pattern for each side. If the minimum distance is equal to or less than the threshold implying the distance at which the stencil type EB mask can be prepared, it adds the auxiliary pattern having the sufficient area to support the adjacent portion, in the adjacent portion between the patterns linked to each other at the minimum distance. Or, it shifts a part of the complementary pattern in the predetermined direction so that the adjacent portion between the patterns linked to each other at the minimum distance has the sufficient area to support the adjacent portion. Due to such configuration, it is possible to obtain the stencil type EB mask in which not only the donut problem and the leaf problem but also the checkered flag problem can be solved. In particular, it is not necessary for the designer to detect the point contact pattern and the micro bridge pattern and modify the complementary pattern. Hence, the point contact pattern and the micro bridge pattern can be surely detected to thereby solve the checkered flag problem caused by the oversight of the point contact pattern and the micro bridge pattern.

Also, if the distance from the adjacent small pattern exceeds the second threshold implying the sufficient length to support the adjacent portion to the small pattern, the generation of the scanning line is stopped prior to the arrival at the adjacent small pattern. Accordingly, it is possible to reduce the calculation time required to determine the distance from the adjacent small pattern.

What is claimed is:

1. A method of designing EB (electron beam) mask, comprising the steps of:
   (a) dividing an integrated circuit pattern into two complementary patterns;
   (b) scanning around one, as an object pattern, of small patterns included in one of said two complementary patterns, while measuring a distance from said object pattern to said small patterns adjacent to said object pattern;
   (c) registering a minimum of distances from said object pattern to said adjacent small patterns; and
   (d) changing a shape of at least one of said small patterns based on said minimum distance.

2. The method of designing EB mask according to claim 1, wherein said (d) changing step comprises the step of:
   (e) adding an auxiliary pattern between said object pattern and the most adjacent one of said adjacent small patterns.

3. The method of designing EB mask according to claim 2, wherein said (e) adding step comprises the steps of:
   (f) adding said auxiliary pattern in said one complementary pattern; and
   (g) deleting a pattern having the same shape as that of said auxiliary pattern from a place corresponding to said auxiliary pattern in the other of said two complementary patterns.

4. The method of designing EB mask according to claim 1, wherein said (d) changing step comprises the step of:
   (h) shifting a part of said one complementary pattern in a predetermined direction.

5. The method of designing EB mask according to claim 4, wherein said (h) shifting step comprises the steps of:
   (i) shifting said part of said one complementary pattern in said predetermined direction; and
   (j) deleting a pattern having the same shape as that of said part from a place corresponding to said part in the other of said two complementary patterns.

6. The method of designing EB mask according to claim 1, wherein said (b) scanning step comprises the step of:
   (k) stopping said scan, if said distance exceeds a threshold.

7. An apparatus for designing EB mask comprising:
   a memory; and
   a processor which:
      divides an integrated circuit pattern into two complementary patterns;
      scans around one, as an object pattern, of small patterns included in one of said two complementary patterns, while measures a distance from said object pattern to said small patterns adjacent to said object pattern;
      registers a minimum of distances from said object pattern to said adjacent small patterns in said memory; and
      changes a shape of at least one of said small patterns based on said minimum distance.

8. The apparatus for designing EB mask according to claim 7, wherein said processor adds an auxiliary pattern between said object pattern and the most adjacent one of said adjacent small patterns.

9. The apparatus for designing EB mask according to claim 8, wherein said processor adds said auxiliary pattern in said one complementary pattern; and
   deletes a pattern having the same shape as that of said auxiliary pattern from a place corresponding to said auxiliary pattern in the other of said two complementary patterns.

10. The apparatus for designing EB mask according to claim 7, wherein said processor shifts a part of said one complementary pattern in a predetermined direction.

11. The apparatus f or designing EB mask according to claim 10, wherein said processor shifts said part of said one complementary pattern in said predetermined direction; and
   deletes an pattern having the same shape as that of said part from a place corresponding to said part in the other of said two complementary patterns.

12. The apparatus for designing EB mask according to claim 7, wherein said processor stops said scan, if said distance exceeds a threshold.

* * * * *